US008911643B2

(12) United States Patent
Kamimura

(10) Patent No.: US 8,911,643 B2
(45) Date of Patent: Dec. 16, 2014

(54) POLISHING LIQUID AND POLISHING METHOD

(75) Inventor: Tetsuya Kamimura, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 553 days.

(21) Appl. No.: 12/453,970

(22) Filed: May 28, 2009

(65) Prior Publication Data

US 2009/0298290 A1 Dec. 3, 2009

(30) Foreign Application Priority Data

May 30, 2008 (JP) .................................. 2008-143468

(51) Int. Cl.
| C09K 13/06 | (2006.01) |
| H01L 21/3105 | (2006.01) |
| C09G 1/02 | (2006.01) |
| C09K 3/14 | (2006.01) |
| H01L 21/321 | (2006.01) |

(52) U.S. Cl.
CPC ...... *H01L 21/3212* (2013.01); *H01L 21/31053* (2013.01); *C09G 1/02* (2013.01); *C09K 3/1463* (2013.01)
USPC .............. 252/79.4; 252/79.1; 216/88; 216/96

(58) Field of Classification Search
CPC C09G 1/02; H01L 21/3212; H01L 21/31053; C09K 3/1463; C23F 3/00
See application file for complete search history.

(56) References Cited

U.S. PATENT DOCUMENTS

| 3,595,823 | A | * | 7/1971 | Huang et al. .................. 524/747 |
| 4,220,204 | A | * | 9/1980 | Hughes et al. ............. 166/270.1 |
| 4,469,608 | A | * | 9/1984 | Hinkamp ...................... 507/255 |
| 4,569,991 | A | * | 2/1986 | Fujino ............................ 528/492 |
| 4,739,041 | A | * | 4/1988 | Morrow et al. ................ 530/504 |
| 4,816,333 | A | * | 3/1989 | Lange et al. ................... 428/331 |
| 5,622,551 | A | * | 4/1997 | Erbe et al. ........................ 106/35 |
| 5,891,205 | A | * | 4/1999 | Picardi et al. ................... 51/308 |
| 6,746,997 | B2 | * | 6/2004 | Carr et al. ...................... 510/356 |

(Continued)

FOREIGN PATENT DOCUMENTS

| JP | 2005-93816 | 4/2005 |
| JP | 2006-339597 | 12/2006 |
| JP | 2006-344836 | 12/2006 |
| JP | 2007-12922 | 1/2007 |
| JP | 2008-117807 A | 5/2008 |
| WO | WO-2006/115393 A1 | 11/2006 |

OTHER PUBLICATIONS

Cambridge.org, British English Dictionary and Thesaurus, Nov. 2011, Cambridge.org.*

(Continued)

*Primary Examiner* — Binh X Tran
*Assistant Examiner* — David Cathey, Jr.
(74) *Attorney, Agent, or Firm* — Jean C. Edwards, Esq.; Edwards Neils PLLC

(57) ABSTRACT

A polishing liquid which is used for chemical mechanical polishing of a body to be polished in a planarization process for manufacturing of a semiconductor integrated circuit, the body to be polished including at least a first layer containing polysilicon or modified polysilicon and a second layer containing at least one selected from the group consisting of silicon oxide, silicon nitride, silicon carbide, silicon carbonitride, silicon oxycarbide, and silicon oxynitride, the polishing liquid having a pH of 1.5 to 7.0, including (1) colloidal silica particles, (2) an organic acid, and (3) an anionic surfactant, and being capable of selectively polishing the second layer with respect to the first layer.

4 Claims, 1 Drawing Sheet

(56) References Cited

U.S. PATENT DOCUMENTS

| | | | |
|---|---|---|---|
| 6,783,434 B1* | 8/2004 | Akahori et al. | 451/41 |
| 2006/0108326 A1* | 5/2006 | Dysard et al. | 216/88 |
| 2006/0205219 A1* | 9/2006 | Baker et al. | 438/692 |
| 2007/0209287 A1* | 9/2007 | Chen et al. | 51/307 |
| 2007/0249167 A1* | 10/2007 | Zhang et al. | 438/692 |
| 2007/0298612 A1* | 12/2007 | Dysard et al. | 438/689 |
| 2008/0104893 A1 | 5/2008 | Oh | |
| 2009/0081871 A1* | 3/2009 | Dysard et al. | 438/693 |

OTHER PUBLICATIONS

Oxford University Press, Oxford Compact Dictionary, Nov. 2011, Oxford University Press.*

Macmillan Publishers Limited, American English Dictionary, Nov. 2011, Macmillan Publishers Limited.*

Kirk et al, Kirk-Othermer Encyclopedia of Chemical Technology, Dec. 4, 2000, Wiley, p. 1-26.*

Flick, Industrial Surfactants Second Edition, 1993, Noyes, 3 pages (cover, ISBN page, and p. 502).*

PubChem, Triton X-301—Compound Summary, Jul. 30, 2013, PubChem, p. 1-3.*

Dow, Dow Surfactnats, Mar. 31, 2006, Dow.*

Dow, DOWFAX 3B2 Surfactant Technical Data Sheet, Feb. 5, 2014, Dow.*

Chemical Register, alkyldiphenyl oxide disulfonate, Feb. 5, 2014, Chemical Register.*

Pubchem, CID 22833332, Feb. 5, 2014, Pubchem.*

Notification for the Opinion of Examination issued by TIPO on May 5, 2014, in connection with corresponding Taiwanese Patent Application No. 098117663.

* cited by examiner

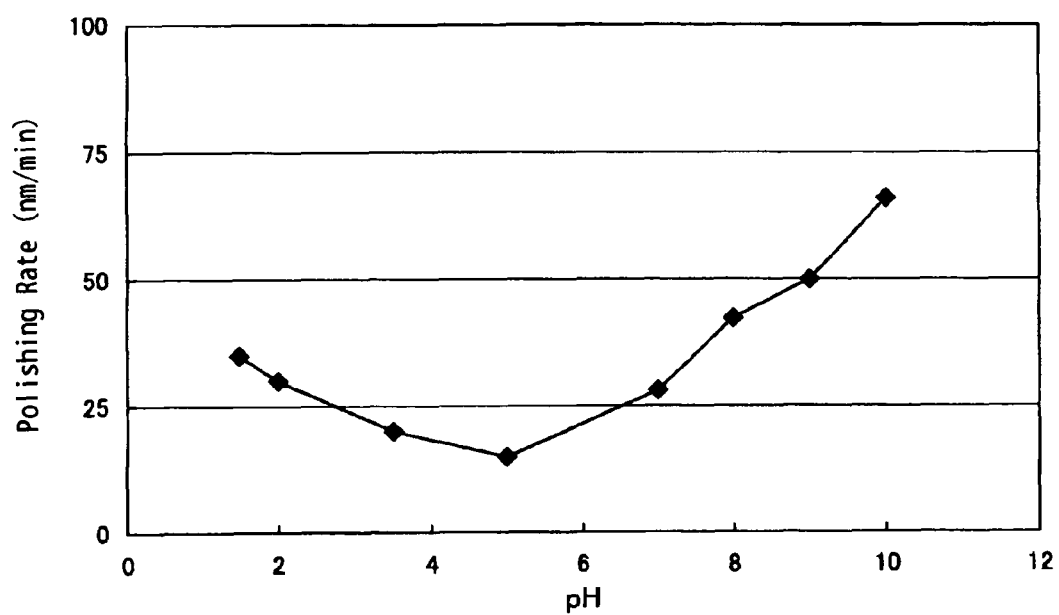

US 8,911,643 B2

POLISHING LIQUID AND POLISHING METHOD

CROSS-REFERENCE TO RELATED APPLICATION

This application claims priority under 35 USC 119 from Japanese Patent Application No. 2008-143468, filed May 30, 2008, the disclosure of which is incorporated by reference herein.

BACKGROUND OF THE INVENTION

1. Field of the Invention

The present invention relates to a polishing liquid used in a process of producing a semiconductor integrated circuit and a polishing method using the same. More specifically, the present invention relates to a polishing liquid that can be preferably used for the formation of a gate on a semiconductor substrate and a polishing method using the same. In particular, the present invention relates to a polishing liquid for polishing a semiconductor substrate having a layer containing polysilicon or modified polysilicon by chemical mechanical polishing and a polishing method using the same.

2. Description of the Related Art

In recent years, in the development of semiconductor devices such as a semiconductor integrated circuit (hereinafter sometimes referred to as an "LSI"), high density and high integration by miniaturization and lamination of wiring have been required in order to realize reduced size and high speed. As a technique for achieving the above, various techniques, such as chemical mechanical polishing (hereinafter sometimes referred to as "CMP"), have been used. CMP is an essential technique at the time of planarizing the surface of films to be processed such as an interlayer insulating film, plug formation, formation of embedded metal wiring, or the like, and thereby smoothing of a substrate or the like is performed.

A usual CMP process includes: adhering a polishing pad onto a circular polishing platen; immersing the surface of the polishing pad in a polishing liquid; pressing the surface (surface to be polished) of a substrate (wafer) against the pad, and rotating both the polishing platen and the substrate while a given pressure (polishing pressure) is applied thereto from the rear face to planarize the surface of the substrate by the mechanical friction generated.

In recent years, CMP has been increasingly applied to respective processes in semiconductor manufacturing. For example, CMP is applied to a gate formation process in the manufacturing of transistors.

In conventional transistors, a gate mainly containing modified polysilicon in which impurities, such as B, are doped in polysilicon, has been manufactured. However, in transistors after the 45 nm generation, the use of a gate insulating film with a high dielectric constant (High-k film) and a metal gate electrode in place of conventional polysilicon has been examined so as to achieve both reduction in power consumption during a standby state and high current driving ability. Some techniques to which these have been applied have been proposed. For example, a method has been proposed which includes: forming a dummy gate insulating film and a dummy gate electrode; doping impurities into a polycrystalline silicon film in a self-alignment manner to form a source-drain diffusion layer; removing the dummy gate insulating film and the dummy gate electrode; and then forming a gate insulating film with a high dielectric constant and a metal gate electrode (e.g., Japanese Patent Application Laid-Open (JP-A) Nos. 2006-339597, 2006-344836, and 2007-12922).

Further, some techniques for forming a metal gate electrode have been proposed. As one example thereof, there is a fully silicided gate (hereinafter referred to as a "FUSI gate"). The FUSI gate is formed by siliciding a gate electrode formed with polysilicon in the same manner as in a conventional CMOS process. Conventionally, only the upper part of a gate electrode is silicided, but in the FUSI gate, the entire gate electrode is silicided. Since the technique of the conventional CMOS process is useful in the case of the FUSI gate compared with the case of forming a metal gate electrode by a damascene process, the FUSI gate is advantageous in terms of process construction.

In recent years, it has been proposed to, in such formation of a gate using polysilicon or modified polysilicon (hereinafter sometimes collectively referred to simply as "polysilicon or the like"), selectively perform CMP with respect to the polysilicon or the like and second and third materials covering the periphery thereof (e.g., JP-A 2005-93816). However, when a body to be polished containing polysilicon or the like is polished by CMP using a known polishing liquid, there arises a problem that the polysilicon or the like which is intended to remain as a gate material is excessively polished. This problem has led to, for example, deterioration in performance of the obtained LSI.

SUMMARY OF THE INVENTION

According to an aspect of the invention, there is provided a polishing liquid which is used for chemical mechanical polishing of a body to be polished in a planarization process for manufacturing of a semiconductor integrated circuit, the body to be polished comprising at least a first layer containing polysilicon or modified polysilicon and a second layer containing at least one selected from the group consisting of silicon oxide, silicon nitride, silicon carbide, silicon carbonitride, silicon oxycarbide, and silicon oxynitride, the polishing liquid having a pH of 1.5 to 7.0, comprising (1) colloidal silica particles, (2) an organic acid, and (3) an anionic surfactant, and being capable of selectively polishing the second layer with respect to the first layer.

BRIEF DESCRIPTION OF THE DRAWINGS

FIG. 1 is a graph showing changes in polishing rate of polysilicon when the pH of the polishing liquid containing an anionic surfactant was varied.

DETAILED DESCRIPTION OF THE INVENTION

Hereinafter, the polishing liquid and the polishing method using the same according to the invention are described in detail.

[Polishing Liquid]

The polishing liquid of the present invention is a polishing liquid which is used for chemical mechanical polishing of a body to be polished in a planarization process for manufacturing of a semiconductor integrated circuit, the body to be polished comprising at least a first layer containing polysilicon or modified polysilicon and a second layer containing at least one selected from the group consisting of silicon oxide, silicon nitride, silicon carbide, silicon carbonitride, silicon oxycarbide, and silicon oxynitride, the polishing liquid having a pH of 1.5 to 7.0, comprising (1) colloidal silica particles, (2) an organic acid, and (3) an anionic surfactant, and being capable of selectively polishing the second layer with respect to the first layer.

In the present invention, the "polishing liquid" encompasses not only a polishing liquid when used for polishing (i.e., a polishing liquid which has been diluted as required) but a concentrated liquid of the polishing liquid. The concentrated liquid or the concentrated polishing liquid refers to a polishing liquid in which the concentration of the solute has been adjusted to be higher than that of the polishing liquid when used for polishing, and is diluted with water or an aqueous solution before used for polishing. The dilution ratio is generally 1 to 20 times in volume. In this specification, the terms "concentrated" and "concentrated liquid" are used as idiomatic expressions which mean "having a higher concentration" and a "liquid having a higher concentration" than when used for polishing, and are used in a different meanings from the general meanings in which a physical concentration operation such as evaporation is carried out.

The polishing liquid of the invention is preferably used when polysilicon or modified polysilicon is used as an electrode material and a gate electrode in a semiconductor integrated circuit is formed by CMP. More specifically, the polishing liquid of the invention is a polishing liquid which is used for chemical mechanical polishing of a body to be polished in a planarization process for manufacturing of a semiconductor integrated circuit, the body to be polished at least comprising a first layer containing polysilicon or modified polysilicon and a second layer containing at least one selected from the group consisting of silicon oxide, silicon nitride, silicon carbide, silicon carbonitride, silicon oxycarbide, and silicon oxynitride.

The polishing liquid of the invention contains the above components (1), (2) and (3) and has a pH of 1.5 to 7.0. Thus, the second layer containing at least one selected from the group consisting of silicon oxide, silicon nitride, silicon carbide, silicon carbonitride, silicon oxycarbide, and silicon oxynitride can be selectively polished with respect to the first layer containing polysilicon or modified polysilicon.

Regarding the selective polishing of the second layer with respect to the first layer, it is preferable that the polishing liquid of the present invention can polish the body to be polished at a ratio represented by RR(other)/RR(p-Si) in the range of 1.5 to 200 wherein RR(p-Si) represents a polishing rate of the first layer and RR(other) represents a polishing rate of the second layer. More preferably, the ratio represented by RR(other)/RR(p-Si) is in the range of 3 to 100. When the ratio represented by RR(other)/RR(p-Si) is in the above-mentioned range, undesirable polishing of the first layer can be suppressed, and uneven separation of the first layer due to an excessive stress to be applied to the film interface between the first layer and the underlayer at the time of polishing also can be effectively suppressed.

Therefore, by using the polishing liquid of the invention, the gate electrode is not excessively polished but a layer containing silicon materials other than polysilicon or modified polysilicon that is required to be rapidly polished can be rapidly polished even when the gate electrode containing polysilicon or modified polysilicon is formed by CMP in manufacturing of LSI.

Hereinafter, each component constituting the polishing liquid of the invention will be described in detail.

[(1) Colloidal Silica Particles]

The polishing liquid of the invention contains colloidal silica particles as at least a part of abrasive grains. The colloidal silica particles are preferably colloidal silica particles which do not contain impurities, such as alkali metal, in the particles and are obtained by hydrolysis of alkoxysilane. In contrast, colloidal silica particles produced by a method involving removing alkali from an aqueous alkali silicate solution also can be used. However, in this case, alkali metal remaining inside the particles may be gradually eluted to influence the polishing ability. From such a viewpoint, colloidal silica particles obtained by hydrolysis of alkoxysilane are more preferable as a raw material.

The particle diameter of the colloidal silica particles is suitably selected according to the purpose of use. The average primary particle diameter of the colloidal silica particles is preferably in the range of 5 nm to 100 nm, more preferably in the range of 10 nm to 100 nm, and still more preferably in the range of 10 nm to 80 nm. The average secondary particle diameter of the colloidal silica particles is preferably in the range of 10 nm to 300 nm, more preferably in the range of 20 nm to 300 nm, and still more preferably in the range of 20 nm to 200 nm.

The colloidal silica particles in the invention particularly preferably has an average primary particle diameter of 5 nm to 100 nm and an average secondary particle diameter of 10 nm to 300 nm.

When the particle diameter of the colloidal silica particles satisfies the above-mentioned ranges, the generation of polishing damage can be effectively suppressed.

Here, the average primary particle diameter of the colloidal silica particles in the invention refers to the particle diameter at a point where the cumulative frequency of a particle-size accumulation curve obtained in terms of volume is 50%.

The average primary particle diameter of the colloidal silica particles can be measured with an electron microscope (transmission type) or the like.

The average particle diameter of the secondary particles formed by partial aggregation of the colloidal silica particles (average secondary particle diameter) refers to an average particle diameter determined in the particle size distribution obtained by dynamic light scattering method. As a measuring apparatus for determining the particle size distribution, LB-500 manufactured by Horiba is used, for example.

The content (concentration) of the colloidal silica particles in the polishing liquid of the invention is preferably 0.1% by mass to 10% by mass, more preferably 0.5% by mass to 10% by mass, and still more preferably 1% by mass to 8% by mass, based on the total mass of the polishing liquid when used for polishing. More specifically, the content of the colloidal silica particles is preferably 0.1% by mass or more from the viewpoint of achieving a sufficient polishing rate, but preferably 10% by mass or less from the viewpoint of effectively suppressing the occurrence of polishing damage.

In the polishing liquid of the invention, abrasive grains other than the colloidal silica particles can also be used insofar as the effects of the invention are not impaired. However, in such a case, the proportion of the colloidal silica particles to all the abrasive grains is preferably 50% by mass or more and particularly preferably 80% by mass or more. All the abrasive grains contained in the polishing liquid may be the colloidal silica particles.

In the polishing liquid of the invention, examples of the abrasive grains that can be used in combination with the colloidal silica particles include fumed silica, ceria, alumina, and titania. The size of the abrasive grains is preferably not less than the size of the colloidal silica particles but not more than twice the size of the colloidal silica particles.

[(2) Organic Acid]

The polishing liquid of the invention contains at least one organic acid.

The organic acid as used herein serves as an oxidation promoter, pH adjuster, or a buffer, rather than a metal oxidizing agent. As the organic acid, water-soluble organic acids are preferable. Examples include water-soluble organic acids or amino acids. As examples of the organic acids or amino acids, substances selected from the following groups are more suitable, for example.

More specifically, examples of the organic acids include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, hydroxyethyliminodiacetic acid, iminodiacetic acid, acetamido iminodiacetic acid, nitrilotripropanoic acid, nitrilotrimethylphosphonic acid, dihydroxyethyl glycine, tricine, and ammonium salts or alkaline metal salts thereof, or mixtures thereof.

Examples of the amino acids include glycine, L-alanine, β-alanine, L-2-aminobutyric acid, L-norvaline, L-valine, L-leucine, L-norleucine, L-isoleucine, L-alloisoleucine, L-phenylalanine, L-proline, sarcosine, L-ornithine, L-lysine, taurine, L-serine, L-threonine, L-allothreonine, L-homoserine, L-thyrosin, 3,5-diiodo-L-thyrosin, β-(3,4-dihydroxyphenyl)-L-alanine, L-thyroxine, 4-hydroxy-L-proline, L-cysteine, L-methionine, L-ethionine, L-lanthionine, L-cystathionine, L-cystine, L-cysteine acid, L-asparatic acid, L-glutamic acid, S-(carboxymethyl)-L-cysteine, 4-aminobutyric acid, L-asparagine, L-glutamine, azaserine, L-arginine, L-canavanine, L-citrulline, δ-hydroxy-L-lysine, creatine, L-kynurenine, L-histidine, 1-methyl-L-histidine, 3-methyl-L-histidine, ergothioneine, L-tryptophan, actinomycin C1, apamin, angiotensin I, angiotensin II, and antipain.

Among the organic acids, from the viewpoint of achieving a sufficient polishing rate ratio, organic acids having at least one carboxyl group in the molecular structure are preferable. Among the above, compounds represented by the following Formula (I) are preferable.

HOOC—R—COOH    (I)

In Formula (I), R represents an alkylene group having 1 to 20 carbon atoms, an alkynylene group, a cycloalkylene group, an arylene group, or a group obtained by combining two or more thereof.

Examples of an alkylene group having 2 to 20 carbon atoms represented by R include an ethylene group, a propylene group, a butylene group, a pentylene group, a hexylene group, a heptylene group, and an octylene group. Among the above, the ethylene group, the propylene group, and the butylene group are preferable.

As an alkynylene group represented by R, alkynylene groups having 2 to 10 carbon atoms are preferable. Specific examples include an ethynylene group and a propynylene group.

Examples of a cycloalkylene group represented by R include a cyclohexylene group and a cyclopentylene group. Among the above, the cyclohexylene group is preferable.

Specific examples of an arylene group represented by R include a phenylene group and a naphthylene group. Among the above, the phenylene group is preferable.

Each group represented by R may further have a substituent. Examples of the substituent that can be introduced include a hydroxyl group, an amino group, a carboxyl group, a phosphoric acid group, an imino group, a thiol group, a sulfo group, and a nitro group.

Specific examples of the compound represented by Formula (I) include nitrilotriacetic acid, diethylenetriamine pentaacetic acid, ethylenediamine tetraacetic acid, oxalic acid, malonic acid, succinic acid, glutaric acid, adipic acid, pimelic acid, maleic acid, phthalic acid, malic acid, tartaric acid, citric acid, diglycolic acid, 2-furancarboxylic acid, 2,5-furandicarboxylic acid, 3-furancarboxylic acid, 2-tetrahydrofurancarboxylic acid, diglycolic acid, methoxyacetic acid, methoxyphenylacetic acid, and phenoxyacetic acid, or mixtures thereof. Among the above, from the viewpoint of achieving a favorable selectivity, ethylenediamine tetraacetic acid, oxalic acid, malonic acid, succinic acid, glutaric acid, adipic acid, pimelic acid, maleic acid, phthalic acid, malic acid, tartaric acid, citric acid, and diglycolic acid are preferable, and oxalic acid, adipic acid, pimelic acid, maleic acid, malic acid, tartaric acid, citric acid, and diglycolic acid are more preferable.

The organic acid contained in the polishing liquid may be only one kind, or two or more kinds thereof may be used in combination.

The content of the organic acid in the polishing liquid is preferably 0.0001% by mass to 10% by mass, more preferably 0.001% by mass to 1% by mass, and still more preferably 0.01% by mass to 1% by mass based on the mass of the polishing liquid when used for polishing. More specifically, from the viewpoint of achieving a sufficient polishing rate, the content of the organic acid is preferably 0.0001% by mass or more. From the viewpoint of maintaining favorable flatness, the content of the organic acid is preferably 10% by mass or lower.

[(3) Anionic Surfactant]

The polishing liquid of the invention contains an anionic surfactant.

Examples of the anionic surfactant include sulfonate, carboxylate, sulfate, and phosphate. Among the above, from the viewpoint of achieving a favorable polishing rate selectivity, sulfonate is preferable.

More specifically, examples of sulfonate include alkylsulfonate, sulfosuccinate, α-olefin sulfonate, and N-acylsulfonate.

Examples of carboxylate include soap, N-acylamino acid salt, polyoxyethylene, or polyoxypropylene alkyl ether carboxylate, and acyl peptide.

Examples of sulfate include sulfated oil, alkyl sulfate, alkyl ether sulfate, polyoxyethylene or polyoxypropylene alkyl allyl ether sulfate, and alkylamide sulfate.

Examples of phosphate include alkyl phosphate and polyoxyethylene or polyoxypropylene alkyl allyl ether phosphate.

From the viewpoint of achieving a favorable polishing rate selectivity, examples of a preferable anionic surfactant contained in the polishing liquid include at least one compound selected from the group consisting of compounds represented by the following Formulae (II), (III), (IV), and (V).

Hereinafter, these compounds will be described.

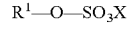

$R^1$—O—SO$_3$X    Formula (II)

In Formula (II), $R^1$ represents an alkyl group having 6 to 30 carbon atoms, an alkenyl group, a cycloalkyl group, an aryl group, an aralkyl group, or a group obtained by combining two or more thereof, and X represents a hydrogen atom, sodium, potassium, ammonium, diethanolamine, or triethanolamine.

Specific examples of the alkyl group having 6 to 30 carbon atoms represented by $R^1$ include a decyl group, a dodecyl group, a tetradecyl group, a hexadecyl group, an octadecyl group, an icosyl group, and a triacontyl group. Among the above, the dodecyl group, the tetradecyl group, the hexadecyl group, and the octadecyl group are preferable.

As the alkenyl group represented by $R^1$, alkenyl groups having 6 to 30 carbon atoms are preferable. Specific examples include a decenyl group, a dodecenyl group, a tetradecenyl group, a hexadecenyl group, an octadecenyl group, an icosenyl group, and a triacontenyl group. Among the above, the dodecenyl group, the tetradecenyl group, the hexadecenyl group, or the octadecenyl group is preferable.

As the cycloalkyl group represented by $R^1$, a cyclohexyl group and an alkyl-substituted cyclohexyl group are preferable.

Specific examples of the aryl group represented by $R^1$ include a phenyl group and a naphthyl group. Among the above, the phenyl group is preferable.

The substituent represented by $R^1$ may further have a substituent. Examples of the substituent that can be introduced include a hydroxy group, an amino group, a carboxyl group, a phosphoric acid group, an imino group, a thiol group, a sulfo group, and a nitro group.

X represents a hydrogen atom, sodium, potassium, ammonium, diethanolamine, or triethanolamine, with sodium, ammonium, a diethanolamine, or triethanolamine being preferable.

The compounds represented by Formula (II) can have a structure of a high molecular weight compound having such a partial structure. There is no limitation on the "polymer containing the partial structure represented by Formula (II)" insofar as it is structured such that the substituent represented by $R^1$ in Formula (II) is combined to the main chain or forms a part of the main chain. For example, high molecular weight compounds in which a structural unit having the structure represented by Formula (II) at the side chain has been polymerized are mentioned. In this case, the degree of polymerization is preferably from 2 to 10 and more preferably from 2 to 5.

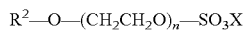

$$R^2—O—(CH_2CH_2O)_n—SO_3X \qquad \text{Formula (III)}$$

In Formula (III), $R^2$ represents an alkyl group having 6 to 30 carbon atoms, an alkenyl group, a cycloalkyl group, an aryl group, an aralkyl group, or a group obtained by combining two or more thereof, n represents an integer of 1 to 10, and X represents a hydrogen atom, sodium, potassium, ammonium, diethanolamine, or triethanolamine.

Specific examples of the alkyl group having 6 to 30 carbon atoms represented by $R^2$ include a decyl group, a dodecyl group, a tetradecyl group, a hexadecyl group, an octadecyl group, an icosyl group, and a triacontyl group. Among the above, the dodecyl group, the tetradecyl group, the hexadecyl group, and the octadecyl group are preferable.

As the alkenyl group represented by $R^2$, alkenyl groups having 6 to 30 carbon atoms are preferable. Specific examples include a decenyl group, a dodecenyl group, a tetradecenyl group, a hexadecenyl group, an octadecenyl group, an icosenyl group, and a triacontenyl group. Among the above, the dodecenyl group, the tetradecenyl group, the hexadecenyl group, or the octadecenyl group is preferable.

As the cycloalkyl group represented by $R^2$, a cyclohexyl group and an alkyl-substituted cyclohexyl group are preferable.

Specific examples of the aryl group represented by $R^2$ include a phenyl group and a naphthyl group. Among the above, the phenyl group is preferable.

The substituent represented by $R^2$ may further have a substituent. Examples of the substituent that can be introduced include a hydroxy group, an amino group, a carboxyl group, a phosphoric acid group, an imino group, a thiol group, a sulfo group, and a nitro group.

n in Formula (III) is an integer of 1 to 10, and from the viewpoint of maintaining a favorable stability over time, it is preferably an integer of 1 to 8, and more preferably an integer of 1 to 5.

X represents a hydrogen atom, sodium, potassium, ammonium, diethanolamine, or triethanolamine, with sodium, ammonium, a diethanolamine, or triethanolamine being preferable.

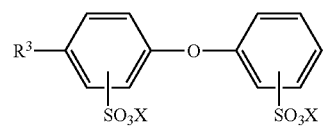

Formula (IV)

In Formula (IV), $R^3$ represents an alkyl group having 6 to 30 carbon atoms, an alkenyl group, a cycloalkyl group, an aryl group, an aralkyl group, or a group obtained by combining two or more thereof, and X represents a hydrogen atom, sodium, potassium, ammonium, diethanolamine, or triethanolamine.

Specific examples of the alkyl group having 6 to 30 carbon atoms represented by $R^3$ include a decyl group, a dodecyl group, a tetradecyl group, a hexadecyl group, an octadecyl group, an icosyl group, and a triacontyl group. Among the above, the dodecyl group, the tetradecyl group, the hexadecyl group, and the octadecyl group are preferable.

As the alkenyl group represented by $R^3$, alkenyl groups having 6 to 30 carbon atoms are preferable. Specific examples include a decenyl group, a dodecenyl group, a tetradecenyl group, a hexadecenyl group, an octadecenyl group, an icosenyl group, and a triacontenyl group. Among the above, the dodecenyl group, the tetradecenyl group, the hexadecenyl group, or the octadecenyl group is preferable.

As the cycloalkyl group represented by $R^3$, a cyclohexyl group and an alkyl-substituted cyclohexyl group are preferable.

Specific examples of the aryl group represented by $R^3$ include a phlenyl group and a naphthyl group. Among the above, the phenyl group is preferable.

The substituent represented by $R^3$ may further have a substituent. Examples of the substituent that can be introduced include a hydroxy group, an amino group, a carboxyl group, a phosphoric acid group, an imino group, a thiol group, a sulfo group, and a nitro group.

X represents a hydrogen atom, sodium, potassium, ammonium, diethanolamine, or triethanolamine, with sodium, ammonium, a diethanolamine, or triethanolamine being preferable.

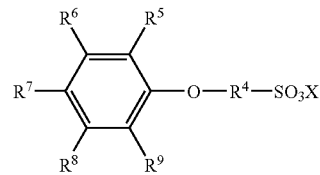

Formula (V)

In Formula (V), $R^4$ represents an alkylene group having 1 to 20 carbon atoms, an alkynylene group, a cycloalkylene group, an arylene group, an alkylene oxide group, or a group obtained by combining two or more thereof.

Specific examples of the alkylene group having 1 to 20 carbon atoms represented by $R^4$ include a methylene group, an ethylene group, a propylene group, a butylene group, a decylene group, and a dodecylene group. Among the above, the methylene group, the ethylene group, and the propylene group are preferable.

As the alkynylene group represented by $R^4$, alkynylene groups having 1 to 20 carbon atoms are preferable. Specific examples include a methynylene group, an ethynylene group, a propynylene group, a butynylene group, a decynylene group, and a dodecynylene group. Among the above, the methynylene group, the ethynylene group, and the propynylene group are preferable.

As the cycloalkylene group represented by $R^4$, a cyclohexylene group and an alkyl-substituted cyclohexylene group are specifically preferable, for example.

Specific examples of the arylene group represented by $R^4$ include a phenylene group and a naphthylene group. Among the above, the phenylene group is preferable.

As the alkylene oxide group represented by $R^4$, an ethylene oxide group or a propylene oxide group is preferable. The alkylene oxide group may be, for example in the case of an ethylene oxide group, a group which consists of one ethylene oxide unit or a plurality of ethylene oxide units (n is 2 or more in $(CH_2CH_2O)_n$). In the case of the group which consists of a plurality of ethylene oxide units, n is preferably in the range of from 2 to 10.

The linking group represented by $R^4$ may further have a substituent. Examples of the substituent that can be introduced include a hydroxy group, an amino group, a carboxyl group, a phosphoric acid group, an imino group, a thiol group, a sulfo group, and a nitro group.

In Formula (V), $R^5$ to $R^9$ each independently represent a hydrogen atom, a hydroxy group, an alkyl group having 1 to 30 carbon atoms, an alkenyl group, a cycloalkyl group, an aryl group, an aralkyl group, a sulfo group, a carboxy group, or a hydrocarbon group containing any of these groups.

Specific examples of the alkyl group having 1 to 30 carbon atoms represented by $R^5$ to $R^9$ include a methyl group, an ethyl group, a propyl group, a butyl group, a hexyl group, a heptyl group, an octyl group, a nonyl group, a decyl group, a dodecyl group, a tetradecyl group, a hexadecyl group, an octadecyl group, an icosyl group, and a triacontyl group.

Specific examples of the alkenyl group represented by $R^5$ to $R^9$ include a decenyl group, a dodecenyl group, a tetradecenyl group, a hexadecenyl group, an octadecenyl group, an icosenyl group, and a triacontenyl group.

As the cycloalkyl group represented by $R^5$ to $R^9$, a cyclohexyl group and an alkyl-substituted cyclohexyl group are preferable.

Specific examples of the aryl group represented by $R^5$ to $R^9$ include a phenyl group and a naphthyl group. Among the above, the phenyl group is preferable.

The substituent represented by $R^5$ to $R^9$ may further have a substituent. Examples of the substituent that can be introduced include a hydroxy group, an amino group, a carboxyl group, a phosphoric acid group, an imino group, a thiol group, a sulfo group, and a nitro group.

Among them, preferable examples of $R^5$ to $R^9$ are a hydrogen atom, an alkyl group having 1 to 20 carbon atoms, a hydroxy group, a sulfo group, a carboxy group, and a hydrocarbon group containing a hydroxy group, a sulfo group, a carboxy group, or the like.

X represents a hydrogen atom, sodium, potassium, ammonium, diethanolamine, or triethanolamine, with sodium, ammonium, a diethanolamine, or triethanolamine being preferable.

Hereinafter, preferable specific examples [Exemplified Compounds (P-1) to (P-28)] of an anionic surfactant that include the compounds represented by Formulae (II) to (V) and that can be preferably used in the invention are shown, but the invention is not limited thereto.

In the following Exemplified Compounds, the degree of polymerization n or m of a polymer is 1 to 5, and, x and y in the Exemplified Compound P-4 satisfy that x+y=10 and x is 1 to 5. p in the Exemplified Compound P-2 is 1 to 3. In the following structures, "H.Na" represents a sulfonic acid compound or a sodium salt thereof.

P-1

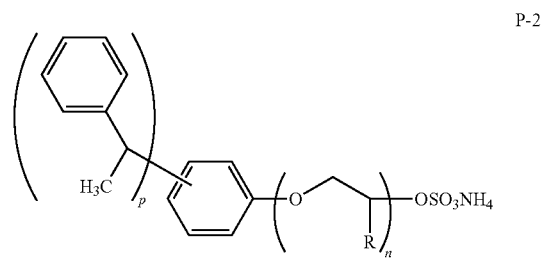

P-2

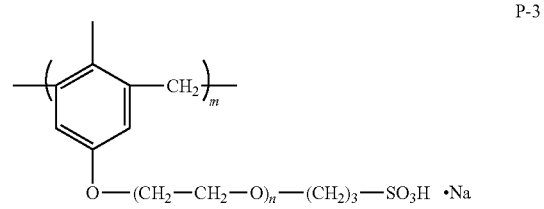

P-3

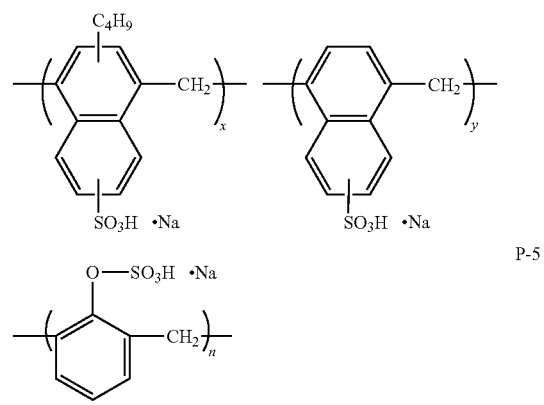

P-4

P-5

P-6 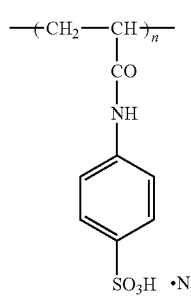
P-7 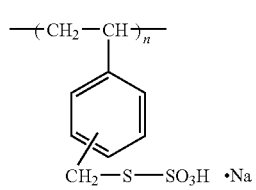
P-8 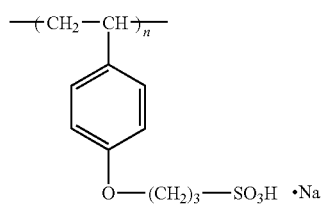
P-9 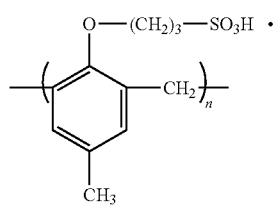
P-10 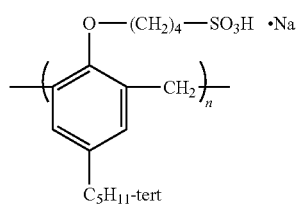
P-11 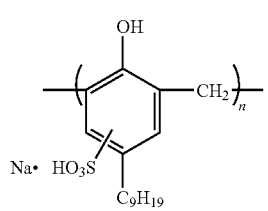
P-12 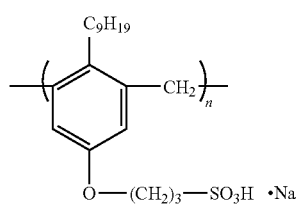
P-13 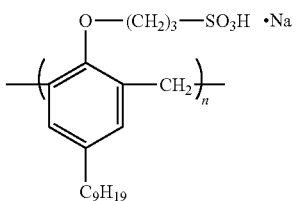
P-14 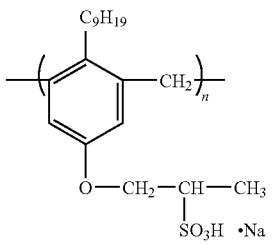
P-15 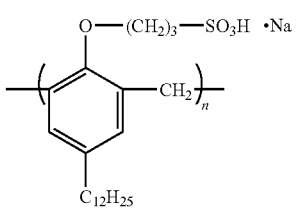
P-16 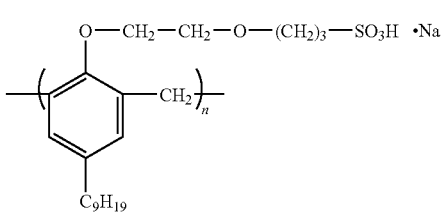
P-17 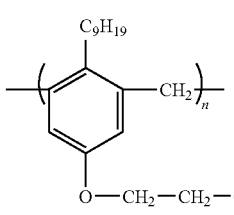
P-18 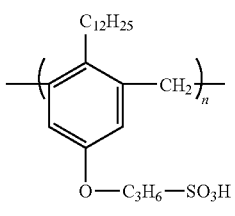
P-19 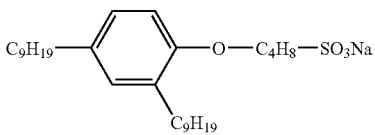

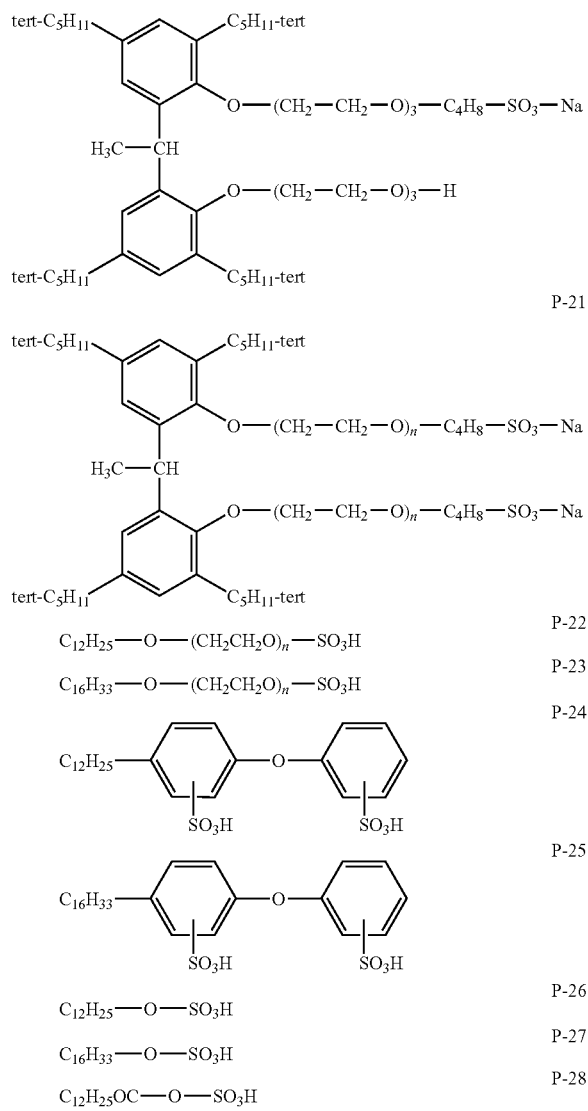

As an anionic surfactant contained in the polishing liquid of the invention, from the viewpoint of achieving a favorable selectivity, P-2, P-3, P-4, P-10, P-13, P-15, P-17, P-19, P-20, P-21, P-22, P-24, P-26, or P-27 is preferable and P-2, P-4, P-13, P-15, P-17, P-20, P-21, P-22, P-24, or P-26 is more preferable, among the compounds represented by Formulae (II), (III), (IV), and (V).

The anionic surfactant contained in the polishing liquid may be one kind, or two or more kinds thereof may be used in combination.

The total amount of the anionic surfactant contained in the polishing liquid is preferably 0.00001% by mass to 1% by mass, more preferably 0.0001% by mass to 1% by mass, and still more preferably 0.0005% by mass to 0.1% by mass based on the total mass of the polishing liquid when used for polishing.

[Other Components]
(pH Adjustor)

The polishing liquid of the invention has a pH of 1.5 to 7.0. It is preferable that the pH be in the range of 2.5 to 7.0. The polishing liquid of the invention provides excellent effects when the pH is in this range.

In order to adjust the pH of the polishing liquid within the above-mentioned range, alkali/acid or a buffer may be used.

Preferable examples of the alkali/acid or the buffer include non-metallic alkali agents such as ammonia, ammonium hydroxide, organic ammonium hydroxides such as tetramethylammonium hydroxide, alkanolamines such as diethanolamine, triethanolamine and tri-isopropanolamine, alkali metal hydroxides such as sodium hydroxide, potassium hydroxide and lithium hydroxide, inorganic acids such as nitric acid, sulfuric acid and phosphoric acid, carbonate such as sodium carbonate, phosphate such as trisodium phosphate, borate, tetraborate, and hydroxybenzoate. Examples of particularly preferable alkali agents include ammonium hydroxide, potassium hydroxide, lithium hydroxide, and tetramethylammonium hydroxide.

The addition amount of the alkali/acid or the buffer may be an amount in which the pH is maintained in a preferable range. The amount is in the range of preferably 0.0001 mol to 1.0 mol and more preferably 0.003 mol to 0.5 mol per 1 L of the polishing liquid when used for polishing.

(Corrosion Inhibitor)

The polishing liquid of the invention may contain a corrosion inhibitor that adheres to the surface to be polished to form a film to thereby control the corrosion of the surface of metal. It is preferable for the corrosion inhibitor in the invention to contain a heterocyclic aromatic compound having 3 or more nitrogen atoms in the molecule and having a condensed ring structure. Here, the "3 or more nitrogen atoms" is preferably atoms forming a condensed ring. As such a heterocyclic aromatic compound, benzotriazole and derivatives obtained by introducing various substituents into benzotriazole are preferable.

Examples of the corrosion inhibitor include benzotriazole, 1,2,3-benzotriazole, 5,6-dimethyl-1,2,3-benzotriazole, 1-(1,2-dicarboxyethyl)benzotriazole, 1-[N,N-bis(hydroxyethyl)aminomethyl]benzotriazole, and 1-(hydroxymethyl)benzotriazole. In particular, it is more preferable that the corrosion inhibitor be selected from 1,2,3-benzotriazole, 5,6-dimethyl-1,2,3-benzotriazole, 1-(1,2-dicarboxyethyl)benzotriazole, 1-[N,N-bis(hydroxyethyl)aminomethyl]benzotriazole, and 1-(hydroxymethyl)benzotriazole.

The addition amount of such a corrosion inhibitor is in the range of preferably 0.01% by mass to 0.2% by mass and more preferably 0.05% by mass to 0.2% by mass based on the mass of the polishing liquid when used for polishing. More specifically, the addition amount of such a corrosion inhibitor is preferably 0.01% by mass or more from the viewpoint of not increasing dishing but is preferably 0.2% by mass or lower from the viewpoint of storage stability.

(Chelating Agent)

In order to reduce adverse effects due to an intermixed polyvalent metal ion or the like, the polishing liquid of the invention preferably contains a chelating agent (i.e., water softener) as required.

As the chelating agent, a widely used water softener which is a precipitation-preventing agent of calcium or magnesium, and a relative compound thereof, are mentioned. Examples include nitrilotriacetic acid, diethylenetriamine pentaacetic acid, ethylenediamine tetraacetic acid, N,N,N-amino trimethylene phosphonic acid, ethylene diamine-N,N,N',N'-tetramethylene sulfonic acid, transcyclohexanediamine tetraacetic acid, 1,2-diaminopropane tetraacetic acid, glycoletherdiamine tetraacetic acid, ethylenediamine orthohydroxyphenyl acetic acid, ethylenediamine disuccinic acid (SS isomer), N-(2-carboxylate ethyl)-L-asparatic acid, β-alaninediacetic acid, 2-phosphonobutane-1,2,4-tricarboxylic acid, 1-hydroxyethylidene-1,1-diphosphonic acid, N,N'-bis (2-hydroxybenzyl)ethylene diamine-N,N'-diacetic acid, and 1,2-dihydroxybenzene-4,6-disulfonic acid.

With respect to the chelating agent, two or more kinds may be used in combination as required.

The addition amount of the chelating agent may be an amount sufficient for sequestering metal ions, such as intermixed polyvalent metal ions or the like. For example, the chelating agent is added in an amount of 0.0003 mol to 0.07 mol per 1 L of the polishing liquid when used for polishing.

[Body to be Polished]

The body to be polished to which the polishing liquid of the invention is applied is a body to be polished containing at least a first layer containing polysilicon or modified polysilicon and a second layer containing at least one selected from the group consisting of silicon oxide, silicon nitride, silicon carbide, silicon carbonitride, silicon oxycarbide, and silicon oxynitride. More specifically, the body to be polished is preferably used when polysilicon or modified polysilicon is used as an electrode material and a gate electrode in a semiconductor integrated circuit is formed by CMP.

Examples of the "modified polysilicon" in the invention include silicon in which impurity elements, such as B or P, have been doped in polysilicon.

Usually, when the gate electrode is formed, the first layer is formed by forming a layer containing silicon oxide or the like on the surface of a substrate, forming a concave portion on the layer by etching or the like, and charging the formed concave portion with polysilicon or modified polysilicon. Next, the second layer containing at least one selected from the group consisting of silicon oxide, silicon nitride, silicon carbide, silicon carbonitride, silicon oxycarbide, and silicon oxynitride is formed as a barrier layer on the surface of the first layer.

In CMP for the formation of the gate electrode, when polishing starts from the surface of the second layer, and then the polishing of the second layer is advanced to expose the surface of the first layer, the polishing rate rapidly decreases, whereby the completion of the polishing of the second layer is detected, and thus excessive polishing of the surface of the polysilicon or modified polysilicon used for the gate electrode is suppressed. The modified polysilicon refers to polysilicon in which impurities, such as B or P, have been doped in polysilicon.

Thereafter, the gate electrode is formed by removing, by etching, portions other than the polysilicon or modified polysilicon that functions as an electrode and the required silicon oxide layer of the periphery thereof.

[Polishing Method]

The polishing method of the invention comprises supplying the above mentioned polishing liquid of the invention to a polishing pad on a polishing platen, rotating the polishing platen, and thereby causing relative motion of the polishing pad and a surface to be polished of a body to be polished while in contact with each other for carrying out polishing.

The polishing liquid of the invention may be: a concentrated liquid, which is diluted with water or an aqueous solution when used (Case 1); prepared by mixing respective components in the form of an aqueous solution mentioned in the following section and optionally diluting with water (Case 2); and a liquid which can be used as it is for carrying out polishing (Case 3). The polishing liquid of any of the above-described cases can be applied to the polishing method of the invention.

As an apparatus used for polishing, a common polishing apparatus having a holder that holds a body to be polished having a surface to be polished (e.g., a wafer on which a conductive material film is formed) and a polishing platen (to which a motor in which the number of rotations can be changed is attached) to which a polishing pad is attached can be used. As the polishing pad, a common nonwoven fabric, foamed polyurethane, porous fluororesin, or the like can be used, and there is no limitation on the polishing pad. There is no limitation on polishing conditions, but the rotation rate of the polishing platen is preferably as low as 200 rpm or lower so that the body to be polished does not jump out. The pressing pressure of the body to be polished having a surface to be polished (film to be polished) against the polishing pad is preferably 0.68 to 34.5 kPa. In order to satisfy the in-plane uniformity in polishing rate of the body to be polished and the flatness of a pattern, the pressing pressure is more preferably 3.40 to 20.7 kPa.

While polishing, the polishing liquid is successively supplied to the polishing pad with a pump or the like.

The body to be polished after the completion of polishing is sufficiently washed in running water, and then dried after removing water drops adhering onto the body to be polished using a spin dryer or the like.

In the invention, when a concentrated liquid is diluted as in the method described in case 1 above, the following aqueous solution can be used. The aqueous solution is water containing at least one of oxidizers, organic acids, additives, and surfactants beforehand. The sum of components contained in the aqueous solution and components contained in a concentrated liquid to be diluted will be the components of a polishing liquid which is used for polishing.

Thus, when a concentrated liquid is diluted with an aqueous solution and then used, a further concentrated liquid can be prepared because components that are difficult to dissolve can be blended later in the form of an aqueous solution.

As a method for adding water or an aqueous solution to a concentrated liquid for dilution, there is a method including mixing a concentrated polishing liquid and water or an aqueous solution by connecting a pipe line for supplying the concentrated polishing liquid and a pipe line for supplying water or an aqueous solution, and supplying the mixed and diluted polishing liquid to the polishing pad. For mixing of a concentrated liquid and water or an aqueous solution, generally performed methods, such as a method including passing the concentrated liquid and water or the aqueous solution through a narrow passage under the application of a pressure for collisional mixing thereof, a method including repeatedly diverting/separating and joining the flow of each of the concentrated liquid and water or the aqueous solution by stuffing the pipe line with a filling such as a glass tube, or a method including providing a blade that rotates under power to the pipe line, are employable.

The supply rate of the polishing liquid is preferably 10 to 1000 ml/min, and, in order to satisfy the in-plane uniformity in polishing rate of the body to be polished and the flatness of a pattern, is more preferably 170 to 800 ml/min.

Furthermore, as a method for polishing while diluting a concentrated liquid with water or an aqueous solution, there is a method including independently providing a pipe line for supplying a polishing liquid and a pipe line for supplying water or an aqueous solution, supplying given amounts of the polishing liquid and water or the aqueous solution to a polishing pad from each pipe line, and carrying out polishing while mixing by causing relative motion of the polishing pad and the surface to be polished. Moreover, a method including adding given amounts of the concentrated liquid and water or the aqueous solution in one container for mixing, supplying the mixed polishing liquid to a polishing pad, and then carrying out polishing can also be employed.

Moreover, as another polishing method, there is a method including dividing components to be contained in the polishing liquid into at least two constituents, diluting them by adding water or an aqueous solution before use, supplying them to a polishing pad on a polishing platen, and bringing the polishing pad into contact with the surface to be polished to cause relative motion of the surface to be polished and the polishing pad for carrying out polishing.

Moreover, additives with low solubility are divided into two constituents (A) and (B). For example, oxidizers, additives, and surfactants are classified into the constituent (A) and organic acids, additives, surfactants, and water are classified into the constituent (B). Then, when they are used, water or an aqueous solution is added for diluting the constituents (A) and (B).

In the case of the above example, three pipe lines for separately supplying the constituent (A), the constituent (B), and water or an aqueous solution are required. For dilution mixing, there is a method including connecting the three pipe lines to one pipe line for supplying them to a polishing pad, and then mixing them in the pipe line. In this case, the two pipe lines are connected, and then another one pipe line can be connected thereto. Specifically, a method including mixing constituents containing additives that are hard to dissolve and other constituents, lengthening a mixing path for securing a dissolving time, and then connecting a pipe line for water or an aqueous solution is mentioned.

As other mixing methods, there is a method including directly leading the three pipe lines to a polishing pad, and mixing by relative motion of the polishing pad and the surface to be polished or a method of mixing the three constituents in one container, and supplying a diluted polishing liquid to the polishing pad therefrom, as described above.

In the above-described polishing method, when one constituent containing an oxidizer is adjusted to 40° C. or less, other constituents are heated in the range of from room temperature to 100° C., and then the one constituent and the other constituents are mixed or diluted by adding water or an aqueous solution, the solution temperature can be adjusted to 40° C. or lower. This method is preferable for increasing the solubility of a raw material with low solubility of the polishing liquid by utilizing a phenomenon in which the solubility becomes high at high temperatures.

A raw material that has been dissolved by heating the above-mentioned other constituents in the range of from room temperature to 100° C. precipitates in the solution when the temperature decreases. Therefore, when the other constituents having low temperatures are used, the precipitated raw material needs to be dissolved by heating beforehand. For the above, a method including supplying the other constituents in which the raw materials have been dissolved by heating and a method including stirring a solution containing a precipitate, supplying the solution, and dissolving the precipitate by heating a pipe line can be employed. There is a possibility that an oxidizer decomposes when the heated other constituents increase the temperature of the one constituent containing an oxidizer to 40° C. or more. Thus, when the heated other constituents and the one constituent containing an oxidizer are mixed, the temperature of the mixture is preferably adjusted to 40° C. or lower.

Thus, in the invention, the components of the polishing liquid may be divided to two or more, and then the divided components may be supplied to the surface to be polished. In this case, the components of the polishing liquid are preferably divided to components containing oxidizers and components containing organic acids, and then supplied. Moreover, the polishing liquid may be formed into a concentrated liquid, and then supplied to the surface to be polished while separately supplying a dilution water.

In the invention, when a method including dividing the components of the polishing liquid to two or more, and then supplying them to the surface to be polished is applied, the supply amount indicates the total amount of the components supplied from the respective pipe lines.

[Pad]

As the polishing pad for polishing that can be applied to the polishing method of the invention, a non-foamed pad or a foamed pad may be used. In the former, a hard synthetic resin bulk material, such as a plastic sheet, is used for the pad. Examples of the latter include an independent foamed body (dry foamed type), a continuous foamed body (wet foamed type), and a two-layer composite (lamination type). In particular, the two-layer composite (lamination type) is preferable. The foaming may be uniform or non-uniform.

The pad may contain abrasive grains (e.g., ceria, silica, alumina, and resin) generally used for polishing. Examples of the pad are classified into soft type and hard type, and any of them may be acceptable. In the lamination type, each layer is preferably different in hardness. As materials, a nonwoven fabric, artificial leather, polyamide, polyurethane, polyester, polycarbonate, and the like are preferable. On the surface in contact with the surface to be polished, a grating groove, a hole, a concentric groove, a spiral groove, or the like may be formed.

[Wafer]

The diameter of a wafer as the body to be polished to which CMP is performed with the polishing liquid in the invention is preferably 200 mm or more and particularly preferably 300 mm or more. When the diameter is 300 mm or more, the effects of the invention may be notably provided.

[Polishing Apparatus]

There is no limitation on an apparatus capable of polishing using the polishing liquid of the invention. Examples include, but not limited thereto, MA-300D (manufactured by Musashino Denshi Co.), Mirra Mesa CMP and Reflexion CMP (manufactured by Applied Materials), FREX200 and FREX300 (manufactured by Ebara Corporation), NPS3301 and NPS2301 (manufactured by NIKON), A-FP-310A and A-FP-210A (manufactured by Tokyo Seimitsu), 2300 TERES (manufactured by Ram Research), and Momentum (manufactured by Speedfam IPEC).

According to the invention, for example, the following exemplified embodiments <1> to <10> are provided.

<1> A polishing liquid which is used for chemical mechanical polishing of a body to be polished in a planarization process for manufacturing of a semiconductor integrated circuit, the body to be polished comprising at least a first layer containing polysilicon or modified polysilicon and a second layer containing at least one selected from the group consisting of silicon oxide, silicon nitride, silicon carbide, silicon carbonitride, silicon oxycarbide, and silicon oxynitride, the polishing liquid having a pH of 1.5 to 7.0, comprising (1) colloidal silica particles, (2) an organic acid, and (3) an anionic surfactant, and being capable of selectively polishing the second layer with respect to the first layer.

<2> The polishing liquid according to <1>, which is capable of polishing the body to be polished at a ratio represented by RR(other)/RR(p-Si) in the range of 1.5 to 200 wherein RR(p-Si) represents a polishing rate of the first layer and RR(other) represents a polishing rate of the second layer.

<3> The polishing liquid according to <1> or <2>, wherein the concentration of the colloidal silica is 0.1% by mass to 10% by mass based on the total mass of the polishing liquid.

<4> The polishing liquid according to any one of <1> to <3>, wherein the colloidal silica has an average primary particle diameter of 5 nm to 100 nm and an average secondary particle diameter of 10 nm to 300 nm.
<5> The polishing liquid according to any one of <1> to <4>, wherein the organic acid contains at least one carboxyl group in a molecule structure thereof.
<6> The polishing liquid according to any one of <1> to <5>, wherein the organic acid is represented by the following Formula (I),

HOOC—R—COOH    (I)

wherein R represents an alkylene group having 1 to 20 carbon atoms, an alkynylene group, a cycloalkylene group, an arylene group, or a group obtained by combining two or more thereof. These groups may further have other substituents.
<7> The polishing liquid according to any one of <1> to <6>, wherein the concentration of the organic acid is 0.001% by mass to 3% by mass based on the total mass of the polishing liquid.
<8> The polishing liquid according to any one of <1> to <7>, wherein the anionic surfactant is at least one compound selected from the group consisting of compounds represented by the following Formulae (II), (III), (IV), and (V), $R^1$—O—$SO_3$X    Formula (II)

wherein in Formula (II), $R^1$ represents an alkyl group having 6 to 30 carbon atoms, an alkenyl group, a cycloalkyl group, an aryl group, an aralkyl group, or a group obtained by combining two or more thereof, and X represents a hydrogen atom, sodium, potassium, ammonium, diethanolamine, or triethanolamine,

$R^2$—O—$(CH_2CH_2O)_n$—$SO_3$X    Formula (III)

wherein in Formula (III), $R^2$ represents an alkyl group having 6 to 30 carbon atoms, an alkenyl group, a cycloalkyl group, an aryl group, an aralkyl group, or a group obtained by combining two or more thereof, n represents an integer of 1 to 10, and X represents a hydrogen atom, sodium, potassium, ammonium, diethanolamine, or triethanolamine,

Formula (IV)

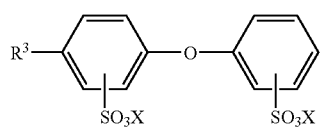

wherein in Formula (IV), $R^3$ represents an alkyl group having 6 to 30 carbon atoms, an alkenyl group, a cycloalkyl group, an aryl group, an aralkyl group, or a group obtained by combining two or more thereof, X represents a hydrogen atom, sodium, potassium, ammonium, diethanolamine, or triethanolamine, and a plurality of Xs may be the same or different from each other, and

Formula (V)

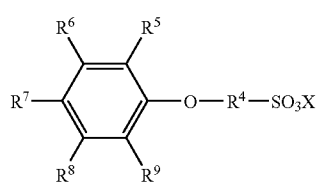

wherein in Formula (V), $R^4$ represents an alkylene group having 1 to 20 carbon atoms, an alkynylene group, a cycloalkylene group, an arylene group, an alkylene oxide group, or a group obtained by combining two or more thereof, $R^5$ to $R^9$ each independently represent a hydrogen atom, a hydroxy group, an alkyl group having 1 to 30 carbon atoms, an alkenyl group, a cycloalkyl group, an aryl group, an aralkyl group, a sulfo group, a carboxyl group, or a hydrocarbon group containing any of these groups, and X represents a hydrogen atom, sodium, potassium, ammonium, diethanolamine, or triethanolamine.
<9> The polishing liquid according to any one of <1> to <8>, wherein the concentration of the anionic surfactant is 0.001% by mass to 1% by mass based on the total mass of the polishing liquid.
<10> A polishing method comprising supplying the polishing liquid according to any one of <1> to <9> to a polishing pad on a polishing platen, rotating the polishing platen, and thereby causing relative motion of the polishing pad and a surface to be polished of a body to be polished while in contact with each other for carrying out polishing.

Therefore, the invention can provide a polishing liquid that can be used for chemical mechanical polishing of a body to be polished having a layer containing polysilicon or modified polysilicon in the manufacturing of a semiconductor integrated circuit, has a high polishing rate, and can selectively suppress polishing of the layer containing polysilicon or modified polysilicon, and a polishing method using the same.

EXAMPLES

Hereinafter, the invention will be more specifically described with reference to Examples, but is not limited to the following Examples.

Examples 1-1 to 1-5, Comparative Examples 1-1 to 1-3

<Preparation of Polishing Liquid>
Polishing liquids (polishing liquids of Examples 1-1 to 1-5 and Comparative Examples 1-1 to 1-3) having the following composition and pH were prepared, and then a wafer having a polysilicon film was polished. Then, the pH dependency of the polishing rate in the polishing of a polysilicon layer (p-Si layer) was evaluated.
—Polishing Liquid Composition—

| | |
|---|---|
| Colloidal silica particles: A1 | 200 g/L |
| Organic acid: Citric acid | 0.5 g/L |
| Anionic surfactant: P-21 | 0.05 g/L |
| Total amount to which pure water was added | 1,000 mL |
| (pH (adjusted with aqueous ammonia and nitric acid) | pH shown in Table 2) |

The shapes and the particle diameters of the colloidal silica particles (A1 to A5) used for each Example in this specification are as shown in Table 1.

TABLE 1

| | Abrasive grain name [Average primary particle diameter (nm), Shape] |
|---|---|
| A1 | PL3 [35 nm, cocoon-shaped] |
| A2 | PL3L [35 nm, spherical] |
| A3 | PL3H [35 nm, aggregate] |

TABLE 1-continued

| | Abrasive grain name [Average primary particle diameter (nm), Shape] |
|---|---|
| A4 | PL2 [25 nm, cocoon-shaped] |
| A5 | PL2L [20 nm, spherical] |

Evaluation was performed using the polishing liquids of Examples 1-1 to 1-5 and Comparative Examples 1-1 to 1-3. The evaluation method is as follows.

<Evaluation Method>
(Polishing Apparatus)

Each wafer film shown below was polished using "MA-300D" manufactured by Musashino Electronics Co., Ltd. as a polishing apparatus while supplying a slurry under the following conditions.

| | |
|---|---|
| Number of rotations of table: | 112 rpm |
| Number of rotations of head: | 113 rpm |
| Polishing pressure: | 18.4 kPa |
| Polishing pad: | IC1400 XY-K-Pad manufactured by Rodel Nitta Co. |
| Polishing liquid supply rate: | 50 ml/min |

(Body to be Polished)

As a body to be polished, a 6 cm×6 cm cut wafer cut out from an 8-inch wafer in which a polysilicon film was formed on an Si substrate was used.

(Evaluation of Polishing Rate)

The layer thickness (nm) before and after polishing of the polysilicon layer (p-Si layer) was measured, and the polishing rate was calculated using the following equation.

Polishing rate (nm/minute)=(Layer thickness before polishing−Layer thickness after polishing)/Polishing time The layer thickness was measured by a non-contact layer thickness meter FE-33 (manufactured by Otsuka Electronics Co., Ltd.).

The obtained results are shown in Table 2. FIG. 1 is a graph showing changes in polishing rate of polysilicon (p-Si) when the pH of the polishing liquid of Example 1 was varied.

TABLE 2

| | pH | p-Si polishing rate (nm/min) |
|---|---|---|
| Example 1-1 | 1.5 | 35.0 |
| Example 1-2 | 2 | 30.0 |
| Example 1-3 | 3.5 | 20.0 |
| Example 1-4 | 5 | 15.0 |
| Example 1-5 | 7 | 28.0 |
| Comparative Example 1-1 | 8 | 42.3 |
| Comparative Example 1-2 | 9 | 50.0 |
| Comparative Example 1-3 | 10 | 66.0 |

As shown in Table 2, the following points were confirmed. In the polishing liquids of Examples 1-1 to 1-5 as the polishing liquid of the invention, the polishing rate with respect to the polysilicon layer is suppressed and is notably suppressed particularly when the pH is in the range of 2 to 7. However, when the pH is lower than 1.5 or exceeds 7, a tendency that the polishing rate with respect to the polysilicon layer increases is observed. In particular, in the polishing liquids of Comparative Examples 1-1 to 1-3 which are outside the scope of the polishing liquid of the invention, the polishing rate with respect to the polysilicon layer remarkably increases in comparison with the polishing liquid of each Example. This confirmed that it is essential for the polishing liquid of the invention to have a pH in the range of 1.5 to 7 from the viewpoint of specific polishing inhibition with respect to the polysilicon layer.

Example 2

<Preparation of Polishing Liquid>

A polishing liquid (polishing liquid of Example 2) having the following composition and pH was prepared.

—Composition 1—

| | |
|---|---|
| Colloidal silica particles: A1 | 200 g/L |
| Organic acid: Citric acid | 0.5 g/L |
| Anionic surfactant: P-1 | 0.05 g/L |
| Total amount to which pure water was added | 1,000 mL |
| (pH (adjusted with aqueous ammonia and nitric acid) | 5.0) |

Polishing evaluation was performed using the polishing liquid of Example 2.

<Evaluation Method>
(Polishing Apparatus)

Each wafer film shown below was polished using "MA-300D" manufactured by Musashino Electronics Co., Ltd. as a polishing apparatus while supplying a slurry under the following conditions.

| | |
|---|---|
| Number of rotations of table: | 112 rpm |
| Number of rotations of head: | 113 rpm |
| Polishing pressure: | 18.4 kPa |
| Polishing pad: | IC1400 XY-K-Pad manufactured by Rodel Nitta Co. |
| Polishing liquid supply rate: | 50 ml/min |

—Body to be Polished—

As a body to be polished, a 6 cm×6 cm cut wafer cut out from 8-inch wafer in which a polysilicon layer (p-Si layer), a silicon oxide layer ($SiO_2$ layer), and a silicon nitride layer ($Si_3N_4$ layer) was formed on an Si substrate was used.

—Polishing Rate, Polishing Rate Ratio—

The layer thickness (nm) before and after polishing of each of the polysilicon layer (p-Si layer), the silicon oxide layer ($SiO_2$-layer), and the silicon nitride layer ($Si_3N_4$ layer) was measured, and the polishing rate was calculated using the following equation. The layer thickness was measured by a non-contact layer thickness meter FE-33 (manufactured by Otsuka Electronics Co., Ltd.).

Polishing rate (nm/minute)=(Layer thickness before polishing−Layer thickness after polishing)/Polishing time The polishing rate ratio represented by RR(other)/RR(p-Si) was calculated for the p-Si layer and the $SiO_2$-layer, and the p-Si layer and the $Si_3N_4$ layer.

The obtained results are shown in Tables 3 and 4.

Examples 3 to 29 and Comparative Examples 1 to 4

The polishing liquids were prepared substantially in the same manner as in the preparation of the polishing liquid of Example 2, except for changing the colloidal silica particles, the anionic surfactant, and the organic acid to the components listed in Tables 3 and 4 and adjusting the pH to the shown values. The obtained polishing liquids of Examples 2 to 29 and Comparative Examples 1 to 4 were evaluated in the same manner as in Example 1, and the experimental results thereof were shown in Tables 3 and 4.

Abrasive particles A1 to A5 are as shown in Table 1.

TABLE 3

| | Colloidal silica particles (content) | Organic acid (Content) | Anionic surfactant (Content) | pH | p-Si polishing rate (nm/min) | $SiO_2$ polishing rate (nm/min) | $Si_3N_4$ polishing rate (nm/min) | Polishing selectivity ($SiO_2$/p-Si) | Polishing selectivity ($Si_3N_4$/p-Si) |
|---|---|---|---|---|---|---|---|---|---|
| Example 2 | A1 (200 g/L) | Citric acid (0.5 g/L) | P-1 (0.05 g/L) | 5.0 | 10 | 27 | 40 | 2.70 | 4.00 |
| Example 3 | A1 (100 g/L) A4 (20 g/L) | Diglycolic acid (0.5 g/L) | P-2 (0.05 g/L) | 5.0 | 8 | 25 | 45 | 3.13 | 5.63 |
| Example 4 | A1 (100 g/L) A3 (100 g/L) | Malic acid (0.5 g/L) | P-3 (0.15 g/L) | 5.0 | 12 | 20 | 35 | 1.67 | 2.92 |
| Example 5 | A2 (200 g/L) | EDTA (0.5 g/L) | P-4 (0.05 g/L) | 5.0 | 12 | 19 | 38 | 1.58 | 3.17 |
| Example 6 | A3 (150 g/L) | Oxalic acid (0.5 g/L) | P-5 (0.20 g/L) | 5.0 | 15 | 21 | 42 | 1.40 | 2.80 |
| Example 7 | A1 (100 g/L) A2 (100 g/L) | Malic acid (0.5 g/L) | P-6 (0.05 g/L) | 5.0 | 12 | 25 | 44 | 2.08 | 3.67 |
| Example 8 | A4 (100 g/L) | EDTA (0.5 g/L) | P-7 (0.05 g/L) | 5.0 | 9 | 32 | 39 | 3.56 | 4.33 |
| Example 9 | A1 (100 g/L) A2 (100 g/L) | Adipic acid (0.5 g/L) | P-8 (0.05 g/L) | 5.0 | 5 | 30 | 38 | 6.00 | 7.60 |
| Example 10 | A1 (100 g/L) A4 (20 g/L) | Maleic acid (0.5 g/L) | P-9 (0.1 g/L) | 5.0 | 12 | 37 | 35 | 3.08 | 2.92 |
| Example 11 | A3 (80 g/L) | Citric acid (0.5 g/L) | P-10 (0.05 g/L) | 5.0 | 11 | 43 | 33 | 3.91 | 3.00 |
| Example 12 | A1 (100 g/L) | Citric acid (0.5 g/L) | P-11 (0.05 g/L) | 5.0 | 14 | 47 | 31 | 3.36 | 2.21 |
| Example 13 | A1 (100 g/L) A2 (20 g/L) | Citric acid (0.5 g/L) | P-12 (0.05 g/L) | 5.0 | 16 | 45 | 54 | 2.81 | 3.38 |
| Example 14 | A5 (150 g/L) | Diglycolic acid (0.5 g/L) | P-13 (0.05 g/L) | 5.0 | 15 | 37 | 36 | 2.47 | 2.40 |
| Example 15 | A1 (100 g/L) | Citric acid (0.5 g/L) | P-14 (0.3 g/L) | 5.0 | 12 | 32 | 45 | 2.67 | 3.75 |
| Example 16 | A3 (100 g/L) | Adipic acid (0.5 g/L) | P-15 (0.05 g/L) | 5.0 | 3 | 31 | 42 | 10.33 | 14.00 |

TABLE 4

| | Colloidal silica particles (content) | Organic acid (Content) | Anionic surfactant (Content) | pH | p-Si polishing rate (nm/min) | $SiO_2$ polishing rate (nm/min) | $Si_3N_4$ polishing rate (nm/min) | Polishing selectivity ($SiO_2$/p-Si) | Polishing selectivity ($Si_3N_4$/p-Si) |
|---|---|---|---|---|---|---|---|---|---|
| Example 17 | A1 (100 g/L) A4 (20 g/L) | Malic acid (0.5 g/L) | P-16 (0.05 g/L) | 5.0 | 15 | 38 | 40 | 2.53 | 2.67 |
| Example 18 | A4 (200 g/L) | EDTA (0.5 g/L) | P-17 (0.05 g/L) | 5.0 | 12 | 33 | 35 | 2.75 | 2.92 |
| Example 19 | A1 (200 g/L) | Diglycolic acid (0.5 g/L) | P-18 (0.05 g/L) | 5.0 | 14 | 36 | 41 | 2.57 | 2.93 |
| Example 20 | A1 (100 g/L) A4 (20 g/L) | Citric acid (0.5 g/L) | P-19 (0.05 g/L) | 5.0 | 2 | 55 | 60 | 27.50 | 30.00 |
| Example 21 | A3 (80 g/L) | Adipic acid (0.5 g/L) | P-20 (0.45 g/L) | 5.0 | 12 | 37 | 45 | 3.08 | 3.75 |
| Example 22 | A3 (80 g/L) | Citric acid (0.5 g/L) | P-21 (0.05 g/L) | 5.0 | 11 | 43 | 37 | 3.91 | 3.36 |
| Example 23 | A1 (100 g/L) | Citric acid (0.5 g/L) | P-22 (0.05 g/L) | 5.0 | 14 | 47 | 39 | 3.36 | 2.79 |
| Example 24 | A1 (100 g/L) A2 (20 g/L) | Oxalic acid (0.5 g/L) | P-23 (0.05 g/L) | 5.0 | 16 | 45 | 50 | 2.81 | 3.13 |
| Example 25 | A2 (150 g/L) | Diglycolic acid (0.5 g/L) | P-24 (0.20 g/L) | 5.0 | 15 | 37 | 26 | 2.47 | 1.73 |
| Example 26 | A1 (100 g/L) | Maleic acid (0.5 g/L) | P-25 (0.05 g/L) | 5.0 | 12 | 32 | 36 | 2.67 | 3.00 |
| Example 27 | A1 (100 g/L) A4 (20 g/L) | Citric acid (0.5 g/L) | P-26 (0.05 g/L) | 5.0 | 3 | 31 | 30 | 10.33 | 10.00 |
| Example 28 | A1 (200 g/L) | Oxalic acid (0.5 g/L) | P-27 (0.10 g/L) | 5.0 | 15 | 38 | 35 | 2.53 | 2.33 |
| Example 29 | A4 (200 g/L) | Diglycolic acid (0.5 g/L) | P-28 (0.05 g/L) | 5.0 | 12 | 33 | 25 | 2.75 | 2.08 |
| Comparative Example 1 | A1 (200 g/L) | Citric acid (0.5 g/L) | — | 5.0 | 26 | 30 | 30 | 1.15 | 1.15 |
| Comparative Example 2 | A1 (200 g/L) | Citric acid (0.5 g/L) | — | 10.0 | 56 | 35 | 12 | 0.63 | 0.21 |
| Comparative Example 3 | — | Citric acid (0.5 g/L) | P-1 (0.05 g/L) | 5.0 | 7 | 3 | 2 | 0.43 | 0.29 |
| Comparative Example 4 | A1 (200 g/L) | — | P-1 (0.05 g/L) | 5.0 | 18 | 10 | 4 | 0.56 | 0.22 |

As is clear from Tables 3 and 4, it is revealed that, by using the polishing liquids of the Examples, excessive polishing of the polysilicon layer is suppressed because the polishing rates of silicon oxide and silicon nitride are high and polishing of the polysilicon layer is selectively suppressed.

All publications, patent applications, and technical standards mentioned in this specification are herein incorporated by reference to the same extent as if each individual publication, patent application, or technical standard was specifically and individually indicated to be incorporated by reference.

What is claimed is:

1. A polishing liquid which is used for chemical mechanical polishing of a body to be polished in a planarization process for manufacturing of a semiconductor integrated circuit, the body to be polished comprising at least a first layer containing polysilicon or modified polysilicon and a second layer containing at least one selected from the group consisting of silicon oxide, silicon nitride, silicon carbide, silicon carbonitride, silicon oxycarbide, and silicon oxynitride, the polishing liquid having a pH of 1.5 to 7.0, consisting of (1) colloidal silica particles, (2) an organic acid, (3) an anionic surfactant, a pH adjustor, and water, and being capable of selectively polishing the second layer with respect to the first layer, wherein the anionic surfactant is at least one compound selected from the group consisting of a sulfonate, a sulfonic acid, a sulfate, and a phosphate.

2. The polishing liquid according to claim 1, wherein the anionic surfactant is at least one compound selected from the group consisting of compounds represented by the following Formulae (II), (III), (IV), and (V),

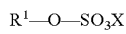    Formula (II)

wherein in Formula (II), $R^1$ represents an alkyl group having 6 to 30 carbon atoms, an alkenyl group, a cycloalkyl group, an aryl group, an aralkyl group, or a group obtained by combining two or more thereof, and X represents a hydrogen atom, sodium, potassium, ammonium, diethanolamine, or triethanolamine,

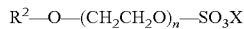    Formula (III)

wherein in Formula (III), $R^2$ represents an alkyl group having 6 to 30 carbon atoms, an alkenyl group, a cycloalkyl group, an aryl group, an aralkyl group, or a group obtained by combining two or more thereof, n represents an integer of 1 to 10, and X represents a hydrogen atom, sodium, potassium, ammonium, diethanolamine, or triethanolamine,

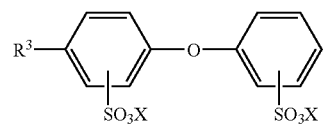    Formula (IV)

wherein in Formula (IV), $R^3$ represents an alkyl group having 6 to 30 carbon atoms, an alkenyl group, a cycloalkyl group, an aryl group, an aralkyl group, or a group obtained by combining two or more thereof, X represents a hydrogen atom, sodium, potassium, ammonium, diethanolamine, or triethanolamine, and a plurality of Xs may be the same or different from each other, and

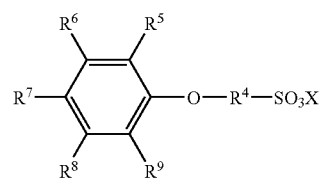    Formula (V)

wherein in Formula (V), $R^4$ represents an alkylene group having 1 to 20 carbon atoms, an alkynylene group, a cycloalkylene group, an arylene group, an alkylene oxide group, or a group obtained by combining two or more thereof, $R^5$ to $R^9$ each independently represent a hydrogen atom, a hydroxy group, an alkyl group having 1 to 30 carbon atoms, an alkenyl group, a cycloalkyl group, an aryl group, an aralkyl group, a sulfo group, a carboxyl group, or a hydrocarbon group containing any of these groups, and X represents a hydrogen atom, sodium, potassium, ammonium, diethanolamine, or triethanolamine.

3. The polishing liquid according to claim 1, wherein (2) the organic acid is selected from the group consisting of nitrilotriacetic acid, diethylenetriamine pentaacetic acid, ethylenediamine tetraacetic acid, oxalic acid, malonic acid, succinic acid, glutaric acid, adipic acid, pimelic acid, maleic acid, phthalic acid, malic acid, tartaric acid, citric acid, diglycolic acid, 2-furancarboxylic acid, 2,5-furandicarboxylic acid, 3-furancarboxylic acid, 2-tetrahydrofurancarboxylic acid, diglycolic acid, methoxyacetic acid, methoxyphenylacetic acid, phenoxyacetic acid, and mixtures thereof.

4. The polishing liquid according to claim 1, wherein (2) the organic acid is a nonpolymeric organic acid.

* * * * *